United States Patent
Shimizu

(10) Patent No.: US 10,541,307 B2
(45) Date of Patent: Jan. 21, 2020

(54) DIODE WITH AN OXYGEN CONCENTRATION REGION

(71) Applicant: Kabushiki Kaisha Toshiba, Minato-ku (JP)

(72) Inventor: Tatsuo Shimizu, Shinagawa (JP)

(73) Assignee: Kabushiki Kaisha Toshiba, Minato-ku (JP)

(*) Notice: Subject to any disclaimer, the term of this patent is extended or adjusted under 35 U.S.C. 154(b) by 269 days.

(21) Appl. No.: 14/751,567

(22) Filed: Jun. 26, 2015

(65) Prior Publication Data

US 2016/0087043 A1    Mar. 24, 2016

(30) Foreign Application Priority Data

Sep. 19, 2014   (JP) ................ 2014-190928

(51) Int. Cl.

| H01L 29/16 | (2006.01) |
|---|---|
| H01L 29/66 | (2006.01) |
| H01L 29/868 | (2006.01) |
| H01L 29/36 | (2006.01) |
| H01L 29/45 | (2006.01) |

(Continued)

(52) U.S. Cl.
CPC ...... *H01L 29/1608* (2013.01); *H01L 21/0485* (2013.01); *H01L 21/324* (2013.01); *H01L 29/36* (2013.01); *H01L 29/45* (2013.01); *H01L 29/6606* (2013.01); *H01L 29/868* (2013.01)

(58) Field of Classification Search
CPC ... H01L 29/1608; H01L 29/167; H01L 29/36; H01L 29/45; H01L 29/6606; H01L 29/868; H01L 21/02236; H01L 21/02255; H01L 21/02529; H01L 21/046; H01L 21/0485;

(Continued)

(56) References Cited

U.S. PATENT DOCUMENTS

| 5,459,107 A * | 10/1995 | Palmour | ............ H01L 21/045 257/E21.055 |
|---|---|---|---|
| 2008/0233285 A1 * | 9/2008 | Das | ............ H01L 21/02236 427/248.1 |

(Continued)

FOREIGN PATENT DOCUMENTS

| JP | 9-52798 | 2/1997 |
|---|---|---|
| JP | 2000-101099 | 4/2000 |

(Continued)

OTHER PUBLICATIONS

Koutarou Kawahara et al. "Detection and Depth Analyses of Deep Levels Generated by ion Implantation in n- and p-Type 4H-SiC", Journal of Applied Physics, vol. 106, No. 1, 2009, 6 pages.

(Continued)

*Primary Examiner* — Mohsen Ahmadi
*Assistant Examiner* — Scott E Bauman
(74) *Attorney, Agent, or Firm* — Oblon, McClelland, Maier & Neustadt, L.L.P.

(57) ABSTRACT

A semiconductor device according to an embodiment includes a p-type SiC layer and a contact electrode electrically connected to the SiC layer. The contact electrode includes metal. And a region is provided in the SiC layer adjacent to the contact electrode. The region having an oxygen concentration not lower than $1 \times 10^{16}$ cm$^{-3}$ and not higher than $1 \times 10^{21}$ cm$^{-3}$.

12 Claims, 10 Drawing Sheets

(51) Int. Cl.
 *H01L 21/04* (2006.01)
 *H01L 21/324* (2006.01)
(58) Field of Classification Search
 CPC ............. H01L 21/324; H01L 29/66068; H01L 29/7395; H01L 29/7802
 USPC .......................................................... 257/77
 See application file for complete search history.

(56) References Cited

U.S. PATENT DOCUMENTS

| | | | | |
|---|---|---|---|---|
| 2010/0224968 | A1* | 9/2010 | Kurita | C30B 15/00 257/655 |
| 2010/0244049 | A1 | 9/2010 | Yamamoto et al. | |
| 2011/0291104 | A1* | 12/2011 | McClure | C30B 29/36 257/77 |
| 2012/0211769 | A1* | 8/2012 | Kusunoki | C30B 19/02 257/77 |
| 2012/0223330 | A1* | 9/2012 | Dhar | H01L 21/225 257/77 |
| 2012/0228630 | A1* | 9/2012 | Shimizu | H01L 29/167 257/77 |
| 2014/0246755 | A1* | 9/2014 | Yoshimura | H01L 29/32 257/617 |
| 2015/0303271 | A1* | 10/2015 | Tanaka | H01L 21/28 257/77 |
| 2016/0087045 | A1 | 3/2016 | Shimizu | |
| 2016/0104622 | A1* | 4/2016 | Oefner | H01L 21/187 257/758 |

FOREIGN PATENT DOCUMENTS

| | | |
|---|---|---|
| JP | 2004-327578 | 11/2004 |
| JP | 2010-225877 | 10/2010 |
| JP | 2012-60166 | 3/2012 |
| JP | 2014-127709 | 7/2014 |
| JP | 2016-63111 A | 4/2016 |

OTHER PUBLICATIONS

Toru Hiyoshi et al. "Reduction of Deep Levels and Improvement of Carrier Lifetime in n-Type 4H-SiC by Thermal Oxidation", Applied Physics Express 2, 2009, 4 pages.
Extended European Search Report dated Mar. 18, 2016 in Patent Application No. 15173835.8.
U.S. Appl. No. 14/813,619, filed Jul. 30, 2015, Shimizu.

\* cited by examiner

DIODE WITH AN OXYGEN CONCENTRATION REGION

CROSS-REFERENCE TO RELATED APPLICATION

This application is based upon and claims the benefit of priority from Japanese Patent Application No. 2014-190928, filed on Sep. 19, 2014, the entire contents of which are incorporated herein by reference.

FIELD

Embodiments described herein relate generally to a semiconductor device and a method of manufacturing the same.

BACKGROUND

SiC (silicon carbide) is expected to be a material for next-generation semiconductor devices. SiC has excellent physical properties, having a band gap three times wider than that of Si (silicon), a breakdown field strength approximately 10 times higher than that of Si, and a heat conductivity approximately three times higher than that of Si. A semiconductor device that has low loss and is capable of high-temperature operation can be realized by taking advantage of those properties.

However, a semiconductor device using SiC has the problem of having a high contact resistance between a p-type SiC layer and a contact electrode. The contact resistance is high, supposedly because the p-type impurity activation rate in the SiC is low.

DETAILED DESCRIPTION

Figure 1:
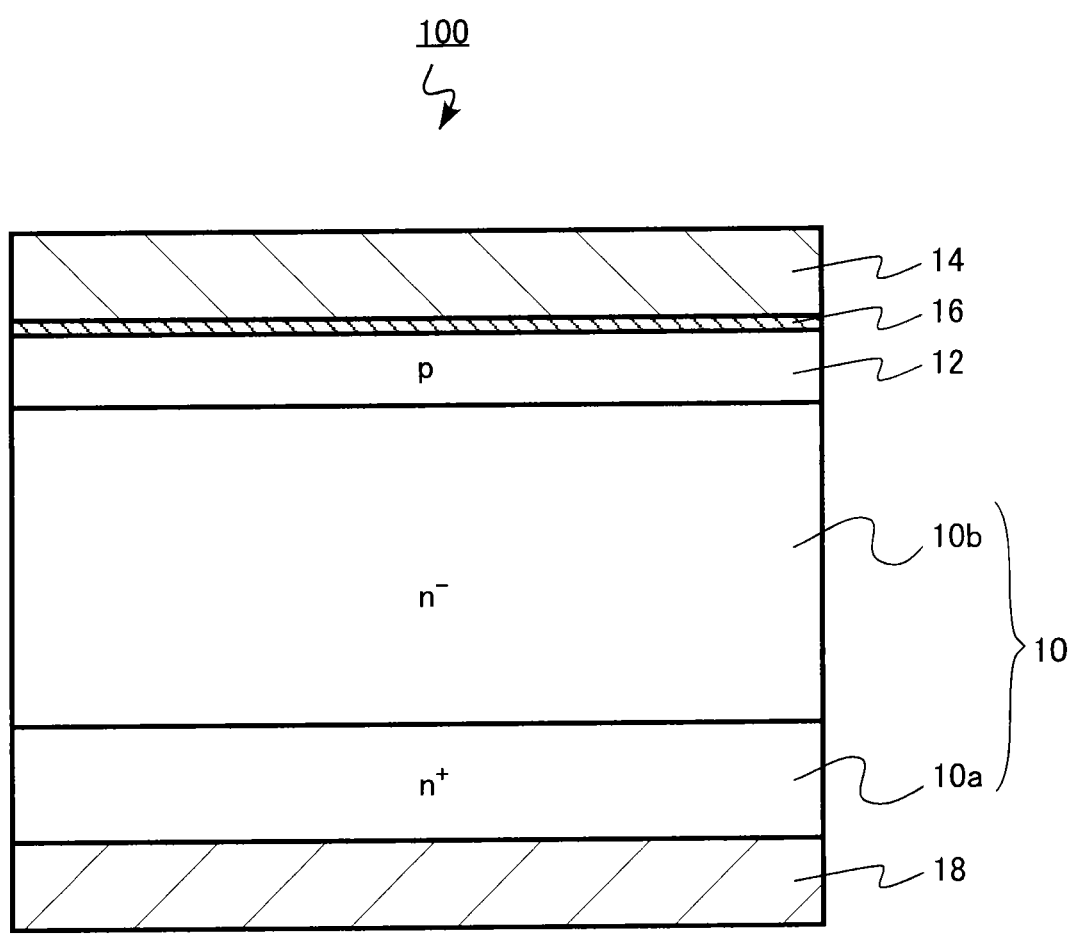
FIG. 1 is a schematic cross-sectional view of a semiconductor device according to a first embodiment.

A semiconductor device according to an embodiment includes: a p-type SiC layer; a contact electrode electrically connected to the SiC layer, the contact electrode including metal; and a region provided in the SiC layer adjacent to the contact electrode, the region having an oxygen concentration not lower than $1\times10^{16}$ cm$^{-3}$ and not higher than $1\times10^{21}$ cm$^{-3}$.

The following is a description of embodiments, with reference to the accompanying drawings. In the following description, similar components may be denoted by same reference numerals, and explanation of components described once will not be repeated.

In the following description, n$^+$, n, n$^-$, p$^+$, p, and p$^-$ indicate relative levels of impurity concentrations in the respective conductivity types. Specifically, the concentration of an n$^+$-type impurity is relatively higher than the concentration of the corresponding n-type impurity, and the concentration of an n$^-$-type impurity is relatively lower than the concentration of the corresponding n-type impurity. Likewise, the concentration of a p$^+$-type impurity is relatively higher than the concentration of the corresponding p-type impurity, and the concentration of a p$^-$-type impurity is relatively lower than the concentration of the corresponding p-type impurity. It should be noted that there are cases where an n$^+$-type and an n$^-$-type are referred to simply as an n-type, and a p$^+$-type and a p$^-$-type are referred to simply as a p-type.

First Embodiment

A semiconductor device according to this embodiment includes: a p-type SiC layer; a metallic contact electrode electrically connected to the SiC layer; and a region (an oxygen region) provided on the contact electrode side of the SiC layer, the region having an oxygen concentration not lower than $1\times10^{16}$ cm$^{-3}$ and not higher than $1\times10^{21}$ cm$^{-3}$.

FIG. 1 is a schematic cross-sectional view of the structure of a PIN diode that is a semiconductor device according to this embodiment.

This PIN diode 100 includes a SiC substrate 10. The SiC substrate 10 is formed with an n$^+$-type SiC layer 10a and an n$^-$-type drift layer 10b on the SiC layer 10a.

The SiC layer 10a includes first and second surfaces. In FIG. 1, the first surface is the upper surface, and the second surface is the lower surface. The SiC layer 10a is the SiC of 4H—SiC containing N (nitrogen) as the n-type impurity at an impurity concentration not lower than $1\times10^{18}$ cm$^{-3}$ and not higher than $1\times10^{20}$ cm$^{-3}$, for example.

Figure 2:
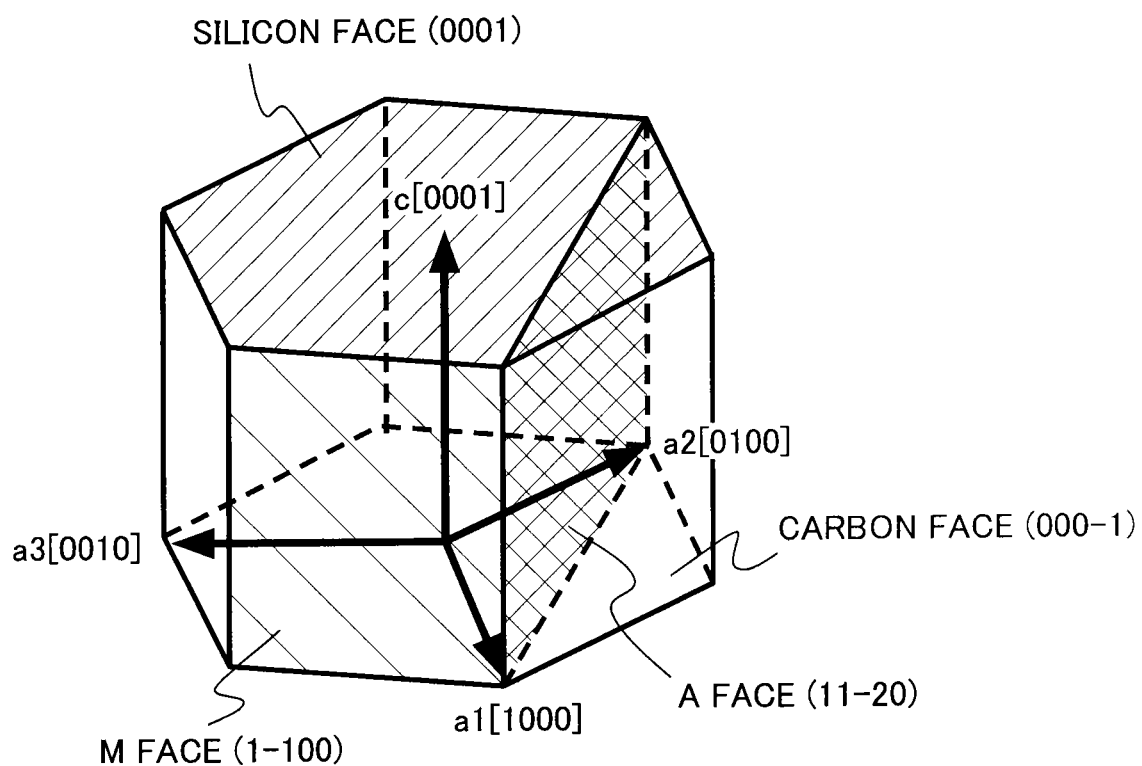
FIG. 2 is a diagram showing a crystalline structure of a SiC semiconductor according to the first embodiment.

FIG. 2 is a diagram showing a crystalline structure of a SiC semiconductor. A typical crystalline structure of a SiC semiconductor is a hexagonal crystal system such as 4H—SiC. One of the surfaces (the top surfaces of the hexagonal prism) having the c-axis extending in the axial direction of the hexagonal prism as the normal line is the (0001) face. The crystal face equivalent to the (0001) face is referred to as the silicon face and is written as the {0001} face. Si (silicon) is arranged in the silicon face.

The other one of the surfaces (the top surfaces of the hexagonal prism) having the c-axis extending in the axial direction of the hexagonal prism as the normal line is the (000-1) face. The crystal face equivalent to the (000-1) face is referred to as the carbon face and is written as the {000-1} face. C (carbon) is arranged in the carbon face.

Meanwhile, a side surface (prismatic surface) of the hexagonal prism is an M face equivalent to the (1-100) face, or is the {1-100} face. The crystal face extending along edge lines that are not adjacent to each other is an A face equivalent to the (11-20) face, or is the {11-20} face. Both Si (silicon) and C (carbon) are arranged in the M face and the A face.

The description below concerns an example case where the first surface of the SiC layer 10a is a surface tilted at zero to eight degrees to the silicon face, and the second surface is a surface tilted at zero to eight degrees to the carbon face. The surface tilted at zero to eight degrees to the silicon face, and the surface tilted at zero to eight degrees to the carbon face can be regarded substantially equivalent to the silicon face and the carbon face, respectively, in terms of characteristics.

The drift layer 10b is an epitaxially grown layer of SiC formed on the SiC layer 10a through epitaxial growth, for example. The concentration of the n-type impurity in the drift layer 10b is not lower than $5 \times 10^{15}$ cm$^{-3}$ and not higher than $2 \times 10^{16}$ cm$^{-3}$, for example.

The surface of the drift layer 10b is a surface tilted at zero to eight degrees to the silicon face. The thickness of the drift layer 10b is not smaller than 5 µm and not greater than 150 µm, for example.

A p-type anode layer (a p-type SiC layer) 12 in which the concentration of the p-type impurity is not lower than $1 \times 10^{18}$ cm$^{-3}$ and not higher than $1 \times 10^{21}$ cm$^{-3}$, for example, is formed on the surface of the drift layer 10b. The depth of the anode layer 12 is approximately 0.3 µm, for example.

A metallic anode electrode (contact electrode) 14 is provided on the anode layer 12. The anode layer 12 and the anode electrode 14 are electrically connected.

The metal forming the anode electrode 14 is Ni (nickel), for example. Another metal such as Al (aluminum) may be stacked on the Ni. The oxygen concentration in the metal forming the anode electrode 14 is lower than $1 \times 10^{16}$ cm$^{-3}$.

An oxygen region (a region) 16 is provided between the anode layer 12 and the anode electrode 14. The oxygen concentration in the oxygen region 16 is equal to or higher than $1 \times 10^{16}$ cm$^3$.

The oxygen region 16 is a SiC layer containing oxygen. The oxygen region 16 has a structure in which one carbon atom in the SiC lattice is substituted by two oxygen atoms. Having this structure, the oxygen region 16 has the carbon vacancy density of the SiC layer lowered.

Figure 3:
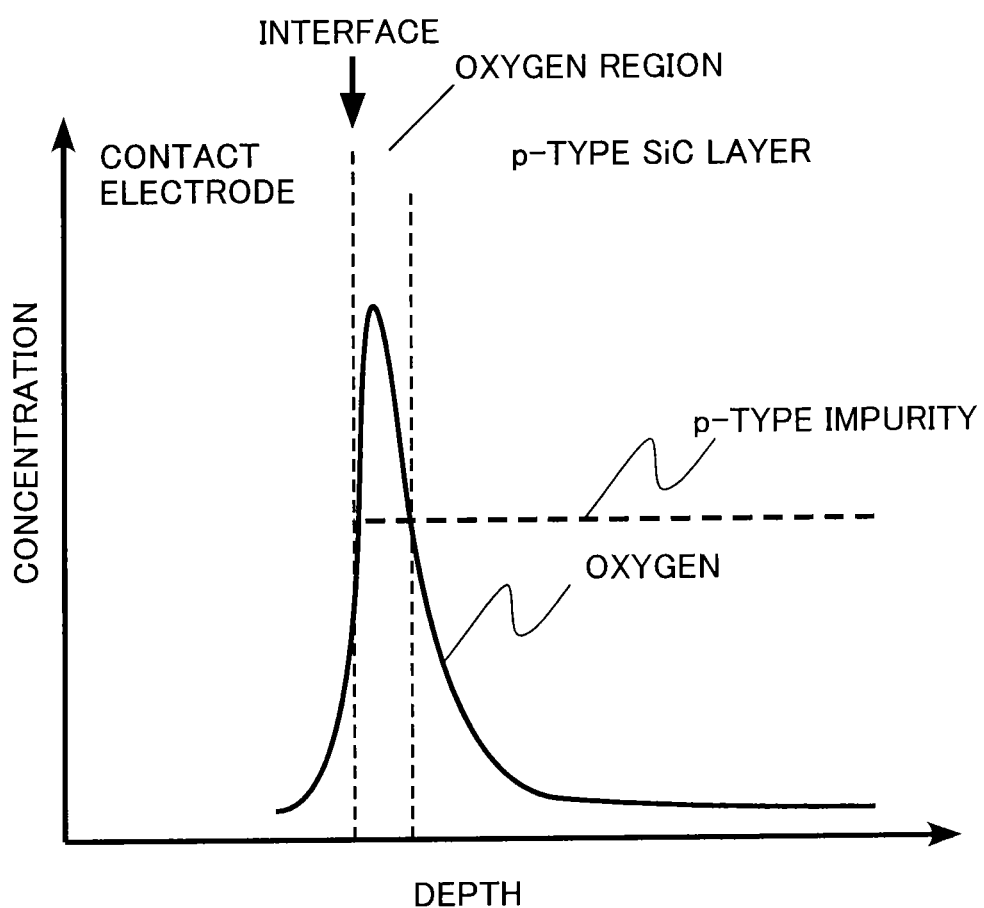
FIG. 3 is a diagram showing the elemental profiles of the semiconductor device according to the first embodiment.

FIG. 3 is a diagram showing the elemental profiles of the semiconductor device according to this embodiment. This diagram shows the concentration profiles of oxygen and the p-type impurity in a cross-section including the p-type anode layer (p-type SiC layer) 12 and the anode electrode (contact electrode) 14.

As shown in FIG. 3, the peak of the oxygen concentration exists on the anode layer 12 side of the interface between the anode layer 12 and the anode electrode 14. The region including this peak is the oxygen region 16. The p-type impurity has a substantially constant concentration in the anode layer 12.

A metallic cathode electrode 18 is formed on the opposite side of the SiC substrate 10 from the drift layer 10b, or on the second surface side. The cathode electrode 18 is formed with stacked layers that are a Ni (nickel) barrier metal layer and an Al (aluminum) metal layer formed on the barrier metal layer, for example. The Ni barrier metal layer and the Al metal layer may form an alloy through a reaction.

In this embodiment, the n-type impurity is preferably N (nitrogen) or P (phosphorus), for example, but it is possible to use As (arsenic), Sb (antimony), or the like. Also, the p-type impurity is preferably Al (aluminum), for example, but it is possible to use B (boron), Ga (gallium), In (indium), or the like.

Next, a semiconductor device manufacturing method according to this embodiment is described. The semiconductor device manufacturing method according to this embodiment includes: forming a p-type SiC layer; forming an oxygen-containing region (an oxygen region) in the SiC layer by performing a heat treatment in an oxygen-containing atmosphere under a condition that the amount of oxidized SiC becomes smaller than 1 nm; and forming a metallic contact electrode on the SiC layer after the formation of the oxygen region. The semiconductor device manufacturing method according to this embodiment is an example of a method of manufacturing the semiconductor device shown in FIG. 1.

FIGS. 4 through 7 are schematic cross-sectional views of the semiconductor device being manufactured by the semiconductor device manufacturing method according to this embodiment.

Figure 4:
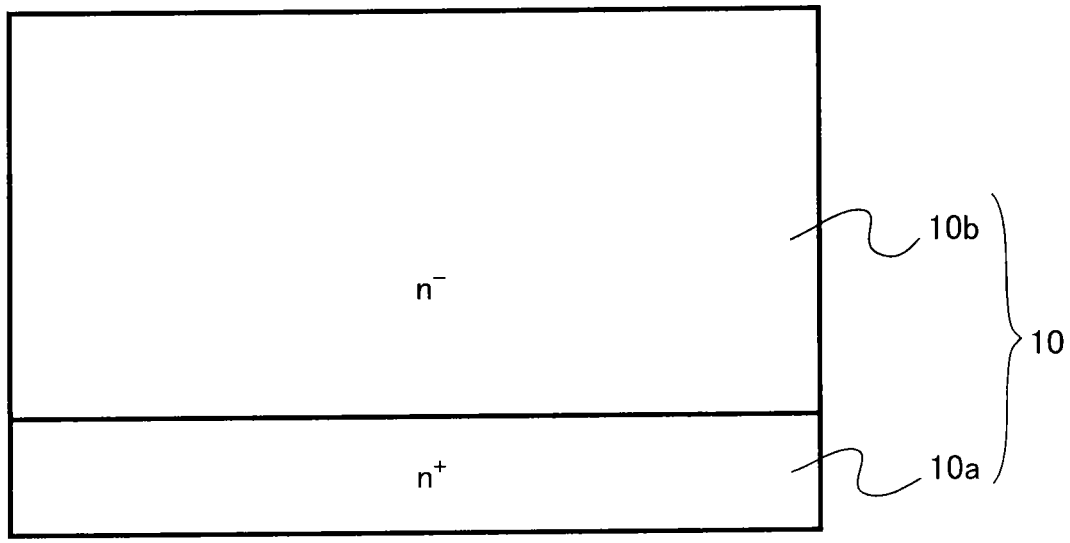
FIG. 4 is a schematic cross-sectional view of the semiconductor device being manufactured by a semiconductor device manufacturing method according to the first embodiment.

First, the n$^+$-type SiC layer 10a having the first surface as the silicon face and the second surface as the carbon face is prepared. The n$^-$-type drift layer 10b is formed on the first surface of the SiC layer 10a by an epitaxial growth technique. The surface of the drift layer 10b is also a surface tilted at zero to eight degrees to the silicon face. The n$^+$-type SiC layer 10a and the n$^-$-type drift layer 10b constitute the SiC substrate 10 (FIG. 4).

Figure 5:
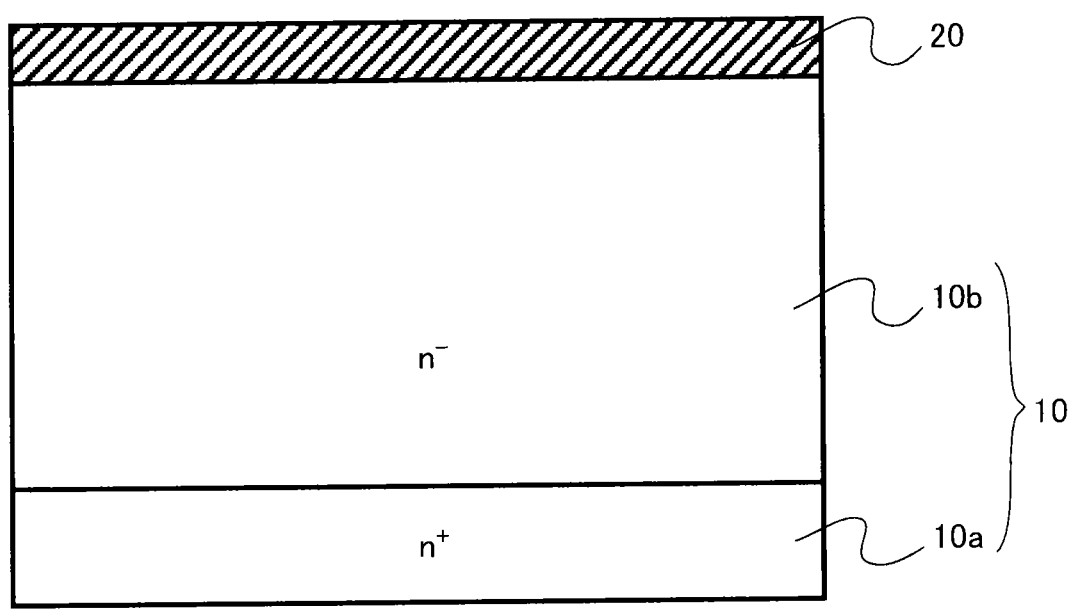
FIG. 5 is a schematic cross-sectional view of the semiconductor device being manufactured by the semiconductor device manufacturing method according to the first embodiment.

A thermally-oxidized film (a first thermally-oxidized film) 20 is then formed on the SiC substrate 10 through thermal oxidation (first thermal oxidation) (FIG. 5). The thermal oxidation is conducted in an oxidizing atmosphere at a temperature not lower than 1200° C. and not higher than 1500° C., for example. A higher temperature is preferable in terms of interstitial carbon diffusion, and a lower temperature is preferable so as to restrain carbon deficiency. The temperature is preferably not lower than 1300° C. and not higher than 1400° C., and is 1350° C., for example.

When the thermally-oxidized film 20 is formed, interstitial carbon diffuses into the SiC substrate 10, and enters carbon vacancies in the SiC substrate 10. As a result, the carbon vacancy concentration in the SiC substrate 10 becomes lower.

The thermally-oxidized film 20 is then removed. For example, the thermally-oxidized film 20 is removed by hydrofluoric-acid wet etching.

P-type impurity ions are then implanted into the SiC substrate 10 by a known ion implantation technique. The p-type impurity is Al (aluminum), for example.

After p-type impurity ions are implanted, activation annealing is performed to activate the p-type impurity. The activation annealing is performed in an inert gas atmosphere at a temperature not lower than 1700° C. and not higher than 1900° C., for example.

Figure 6:
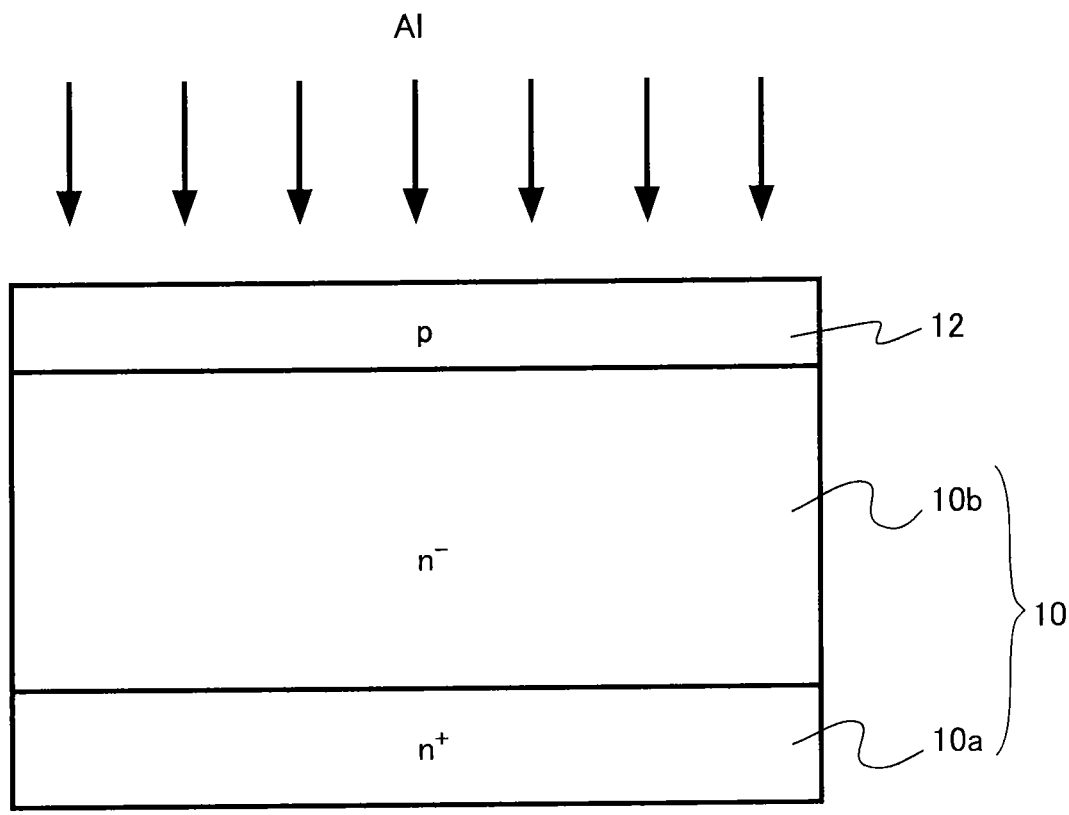
FIG. 6 is a schematic cross-sectional view of the semiconductor device being manufactured by the semiconductor device manufacturing method according to the first embodiment.

Through the p-type impurity ion implantation and the activation annealing, the p-type anode layer 12 is formed (FIG. 6).

Figure 7:
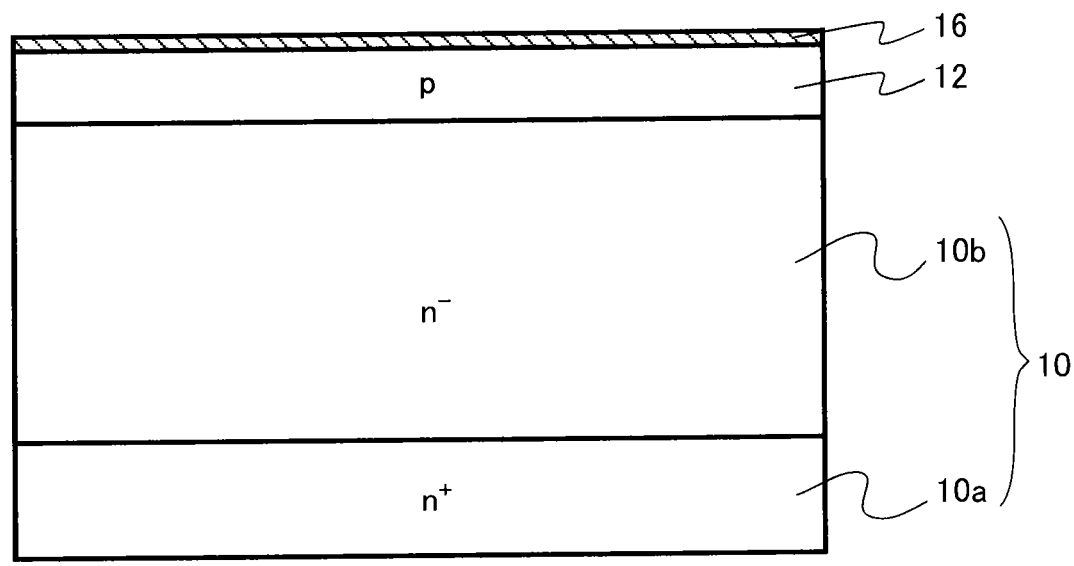
FIG. 7 is a schematic cross-sectional view of the semiconductor device being manufactured by the semiconductor device manufacturing method according to the first embodiment.

In an oxygen-containing atmosphere, a heat treatment is performed under a condition that the amount of oxidized SiC becomes smaller than 1 nm, and the oxygen region 16 is formed on the anode layer 12 (FIG. 7). A test SiC wafer is disposed in the heat treatment furnace, for example, so that the amount of oxidized SiC during the heat treatment can be monitored.

The oxygen region 16 is formed in the surface of the anode layer 12. Through the heat treatment, oxygen diffuses into the anode layer 12, and the oxygen region 16 is formed.

The "condition that the amount of oxidized SiC becomes smaller than 1 nm" in the heat treatment is a condition for not actually oxidizing SiC. The heat treatment is preferably performed at a temperature not lower than 300° C. and not higher than 900° C. The upper limit of the temperature depends on crystal face orientation. The temperature is specified so that the oxidized amount does not exceed 1 nm even if atmospheric dry oxidation is conducted for six hours or longer. The C face is preferably subjected to the heat treatment at 800° C. or lower, the A face and the M face are preferably subjected to the heat treatment at 850° C. or lower, and the Si face is preferably subjected to the heat treatment at 900° C. or lower. The lower limit of the temperature is preferably high so as to facilitate diffusion. Therefore, the C face is preferably subjected to the heat treatment at a temperature not lower than 700° C. and not higher than 800° C., the A face and the M face are preferably subjected to the heat treatment at a temperature not lower than 750° C. and not higher than 850° C., and the Si face is preferably subjected to the heat treatment at a temperature not lower than 800° C. and not higher than 900° C. That is, the heat treatment is preferably performed at approximately 800° C. in any face orientation.

The metallic anode electrode 14 is then formed on the anode layer 12 through a known process. The metallic cathode electrode 18 is also formed on the bottom surface side of the SiC substrate 10, so that the PIN diode 100 of this embodiment shown in FIG. 1 is completed.

In the description below, the functions and the effects of the semiconductor device and the semiconductor device manufacturing method according to this embodiment are described.

Figure 8A:
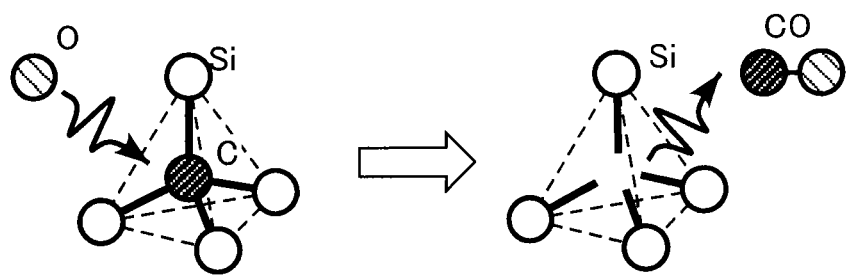
FIGS. 8A, 8B, and 8C are diagrams for explaining a function of the semiconductor device and the semiconductor device manufacturing method according to the first embodiment.
Figure 8B:
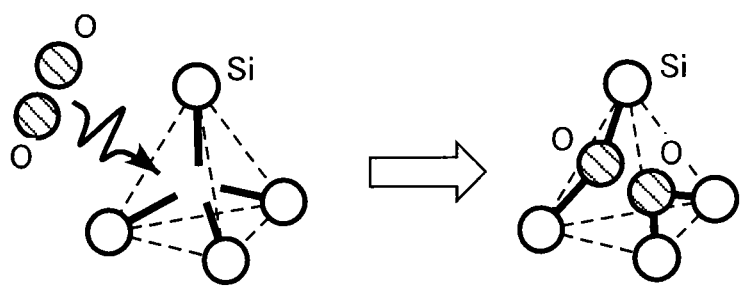
Figure 8C:
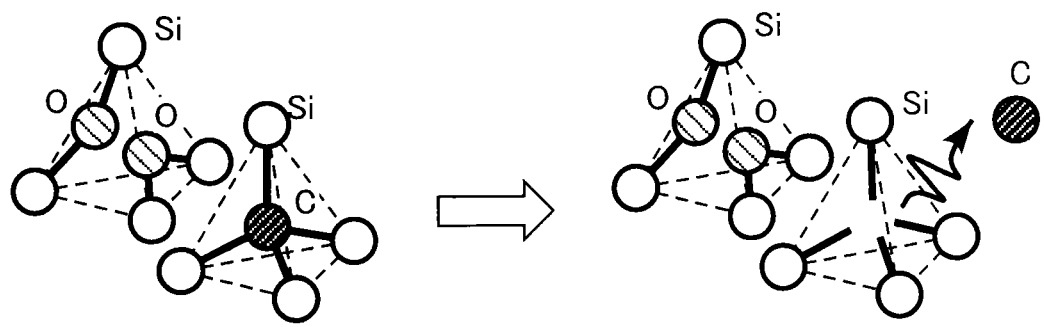

FIGS. 8A, 8B, and 8C are diagrams for explaining a function of the semiconductor device and the semiconductor device manufacturing method according to this embodiment. These diagrams show mechanisms for forming a carbon vacancy based on the first-principle calculation in a case where SiC is oxidized.

When oxygen (O) is supplied from a SiC surface into SiC, the oxygen binds to carbon (C) in the SiC lattice, and carbon monoxide (CO) is generated. As a result, a carbon vacancy is formed (FIG. 8A). This carbon vacancy forming mechanism is referred to as a first carbon vacancy forming mode.

Through the first-principle calculation, it has become apparent that, in a case where a carbon vacancy and two oxygen atoms coexist, a structure in which the carbon vacancy is substituted by the two oxygen atoms becomes stable in terms of energy (FIG. 8B). Si—O—Si bonds are formed in the SiC lattice. As the carbon vacancy is substituted by the two oxygen atoms, a large energy gain of 8.2 eV is obtained.

The structure shown in FIG. 8B is stable in terms of energy. However, if the SiC oxidation progresses at a high temperature, the structure having the two oxygen atoms in the SiC causes strain in the surrounding area, having a large volume. So as to correct the strain, the carbon in a SiC lattice is released to a space between the lattices, and becomes interstitial carbon. As a result, a carbon vacancy is formed (FIG. 8C). This carbon vacancy forming mechanism is referred to as a second carbon vacancy forming mode.

It has become apparent that, in a case where an oxide film is formed through SiC oxidation, a carbon vacancy can be formed in SiC immediately below the oxide film through the two modes; the first carbon vacancy forming mode and the second carbon vacancy forming mode.

Figure 9A:
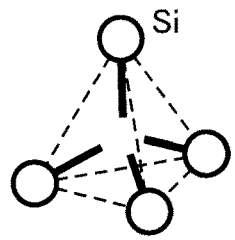
FIGS. 9A and 9B are diagrams for explaining another function of the semiconductor device and the semiconductor device manufacturing method according to the first embodiment.
Figure 9A:
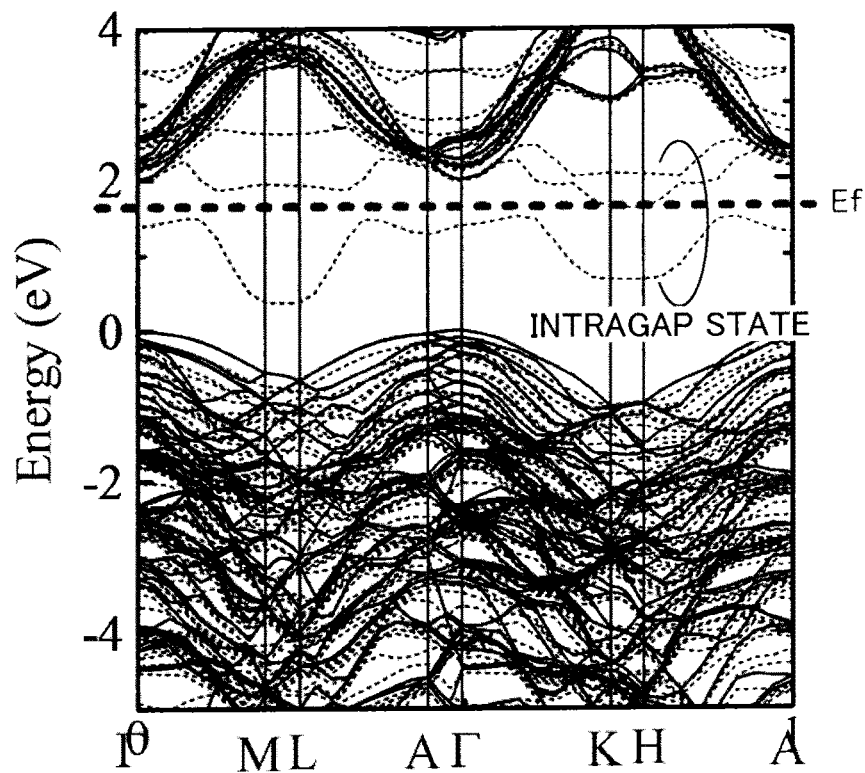
Figure 9B:
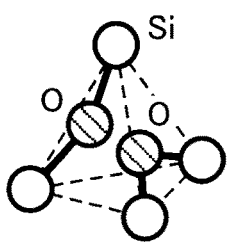
Figure 9B:
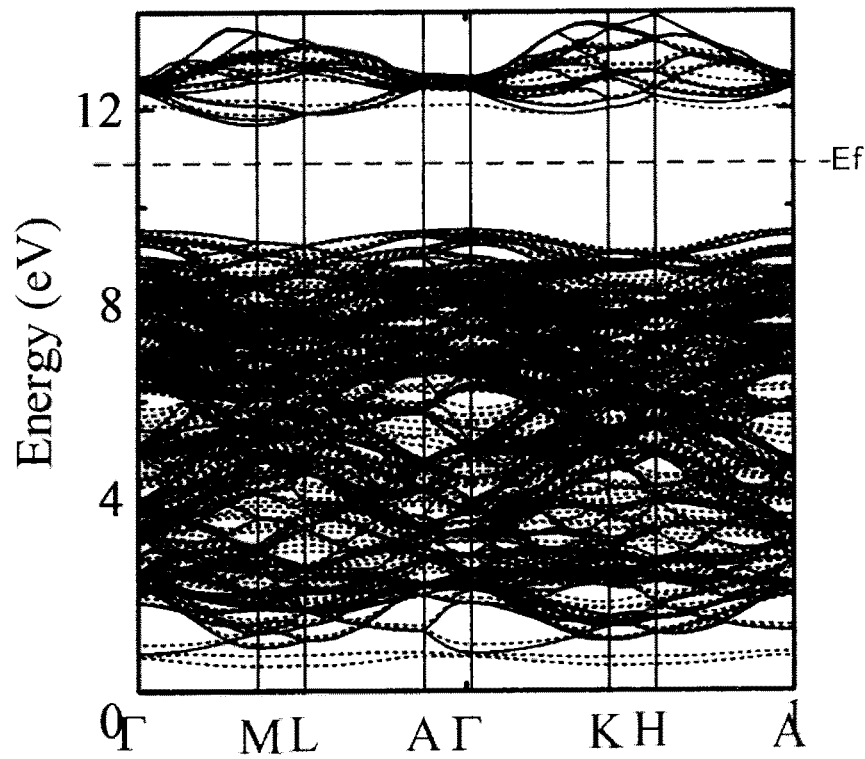

FIGS. 9A and 9B are diagrams for explaining another function of the semiconductor device and the semiconductor device manufacturing method according to this embodiment. FIG. 9A is a band diagram showing a case where a carbon vacancy exists in a SiC lattice. FIG. 9B is a band diagram showing a case where a carbon atom in a SiC lattice is substituted by two oxygen atoms.

As shown in FIG. 9A, in a case where there are carbon vacancies, intragap states are formed in the band gap. As the intragap states interact with each other, localized states are formed at the lower end of the conduction band of the band gap and at the upper end of the valence band.

As shown in FIG. 9B, in a case where a carbon atom in a SiC lattice is substituted by two oxygen atoms, the intragap states disappear. Therefore, any localized state is not formed in the band gap.

If carbon vacancies exist in the interface between a p-type SiC layer and a metallic contact electrode, Fermi-level pinning occurs due to the localized level at the lower end of the conduction band. Therefore, the barrier between the p-type SiC layer and the contact electrode becomes higher, and the contact resistance also becomes higher. Through a study using the first-principle calculation as described above, it has become apparent that a low p-type impurity activation rate and a localized level due to carbon vacancies can cause an increase in contact resistance in a p-type SiC layer.

Carbon vacancies in a contact interface of a PIN diode are formed through epitaxial growth of SiC, ion implantation into SiC, oxidation of SiC, or the like.

In the PIN diode 100 of this embodiment, the oxygen region 16 is formed on the anode layer 12 located immediately below the anode electrode 14. In other words, the oxygen region 16 is formed in the interface between the anode layer 12 and the anode electrode 14.

In the oxygen region 16, a carbon vacancy is substituted by two atoms, so that the carbon vacancy density is lowered. As a result, Fermi-level pinning is restrained, and a PIN diode 100 having a low contact resistance is realized. Thus, a PIN diode 100 with a large forward current is realized.

If carbon vacancies exist in the interface between a p-type SiC layer and a metallic contact electrode, holes are trapped due to the localized level at the upper end of the valence band. As a result, the lifetime of the holes in the p-type SiC layer becomes shorter.

In a PIN diode as a bipolar device, holes as the minority carriers are supplied from the anode layer 12 to the drift layer 10b upon application of a forward bias. Conductivity modulation then occurs, and a large forward current flows. If carbon vacancies exist in the interface between a p-type SiC layer and a metallic contact electrode, the supply of holes from the anode layer 12 to the drift layer 10b decreases due to trapping of holes into the carbon vacancies. As a result, conductivity modulation does not easily occur, and the forward current becomes smaller.

In the PIN diode 100 of this embodiment, on the other hand, the oxygen region 16 is formed on the anode layer 12 located immediately below the anode electrode 14, so that the carbon vacancy density is lowered. As a result, hole trapping is restrained, and a PIN diode 100 with a large forward current is realized.

So as to restrain Fermi-level pinning, the oxygen region 16 is preferably located in the vicinity of the interface between the anode layer 12 and the anode electrode 14. In view of this, the distance between the position of the peak of the oxygen concentration in the oxygen region 16 and the interface between the anode layer 12 and the anode electrode 14 is preferably 10 nm or shorter, and more preferably, is 5 nm or shorter. Since the carbon vacancies interact with each other at approximately 3 nm, the distance can be made as short as approximately 3 nm with respect to the peak position. Therefore, the optimum distance is 3 nm or shorter. The distance to the interface can be measured with an AFM (Atomic Force Microscope), for example. The oxygen distribution can be specifically measured with an atom probe. The full width at half maximum is 10 nm or smaller, 5 nm or smaller, or 3 nm or smaller, respectively.

The oxygen concentration in the oxygen region 16 is preferably not lower than $1 \times 10^{16}$ cm$^{-3}$ and not higher than $1 \times 10^{21}$ cm$^{-3}$. If the oxygen concentration exceeds the above range, there is a possibility that Fermi-level pinning cannot be sufficiently restrained. If the oxygen concentration falls below the above range, there is a possibility that the oxygen region 16 functions as an insulating layer, and the contact resistance becomes higher. More preferably, the oxygen concentration in the oxygen region 16 is not lower than $1 \times 10^{17}$ cm$^{-3}$ and not higher than $1 \times 10^{20}$ cm$^{-3}$. When the process is optimized, the concentration of resultant carbon deficiencies can be adjusted to a value not lower than $5 \times 10^{16}$ cm$^{-3}$ and not higher than $5 \times 10^{20}$ cm$^{-3}$. The optimum concentration is achieved when two oxygen atoms are introduced into each of the resultant carbon deficiencies. As for the lower limit, an effect can be expected when 10% of the lower limit of the carbon deficiency amount is achieved. Therefore, the lower limit of the oxygen concentration is $1 \times 10^{16}$ cm$^{-3}$ or higher, and ideally, $1 \times 10^{17}$ cm$^{-3}$ or higher. As for the upper limit, an effect can be expected when 10% of the upper limit of the carbon defect amount is achieved. Therefore, $1 \times 10^{20}$ cm$^{-3}$ or lower is effective as the upper limit of the oxygen concentration. Further, it is possible to consider the upper limit of the oxygen concentration to be $1 \times 10^{21}$ cm$^{-3}$, which is the value obtained in a case where two oxygen atoms are introduced into all of the carbon defects that have reached the maximum concentration. The oxygen concentration in the oxygen region 16 can be measured by SIMS (Secondary Ion Mass Spectrometry), for example.

The full width at half maximum of the peak of the oxygen concentration in the oxygen region 16 is preferably 10 nm or smaller, and more preferably, 5 nm or smaller, and even more preferably, 3 nm or smaller.

The oxygen region 16 preferably contains Si—O—Si bonds. Whether a bond is a Si—O—Si bond can be determined by XPS (X-ray Photoelectron Spectroscopy) or with a FT-IR (Fourier Transform Infrared) spectrometer.

Also, carbon atoms in SiC lattices are preferably substituted by oxygen atoms in the oxygen region 16. Whether carbon atoms in SiC lattices are substituted by oxygen atoms in the oxygen region 16 can be determined by XPS or with a FT-IR spectrometer.

By the method of manufacturing the PIN diode 100 according to this embodiment, the oxygen region 16 is formed in an oxygen-containing atmosphere under a condition that SiC oxidation does not actually progress. That is, a heat treatment is performed under the condition that the amount of oxidized SiC is smaller than 1 nm. For example, the heat treatment is performed at a low temperature not lower than 300° C. and not higher than 900° C.

As the heat treatment is performed in an oxygen-containing atmosphere under the condition that SiC oxidation does not actually progress, excessive supply of oxygen into SiC is restrained. Accordingly, carbon vacancy formation through the above described first and second carbon vacancy forming mode is restrained. With an appropriate supply of oxygen, each carbon vacancy in the SiC is substituted by two oxygen atoms, and the carbon vacancies in the SiC are reduced.

In a case where the contact electrode is formed on the carbon face in which the oxidation rate is higher than that in the silicon face, the heat treatment for forming the oxygen region 16 is preferably performed at a temperature not lower than 300° C. and not higher than 800° C. The oxidation rate in the A face and the M face is between that in the silicon face and that in the carbon face. Therefore, in a case where the contact electrode is formed on the A face or the M face, the heat treatment is preferably performed at a temperature not lower than 300° C. and not higher than 850° C.

As described above, according to this embodiment, the PIN diode 100 having a low contact resistance is realized. Also, the PIN diode 100 that supplies a large number of holes into the drift layer is realized. Thus, the PIN diode 100 with a large forward current is realized.

Second Embodiment

A semiconductor device according to this embodiment is the same as the semiconductor device according to the first embodiment, except that the p-type impurity is segregated in the interface between the SiC layer and the contact electrode. Also, a semiconductor device manufacturing method according to this embodiment is the same as the method according to the first embodiment, except that a second thermally-oxidized film is formed on the SiC layer through second thermal oxidation after the activation annealing, and is removed prior to the heat treatment. Therefore, the same explanations as those in the first embodiment will not be repeated.

Figure 10:
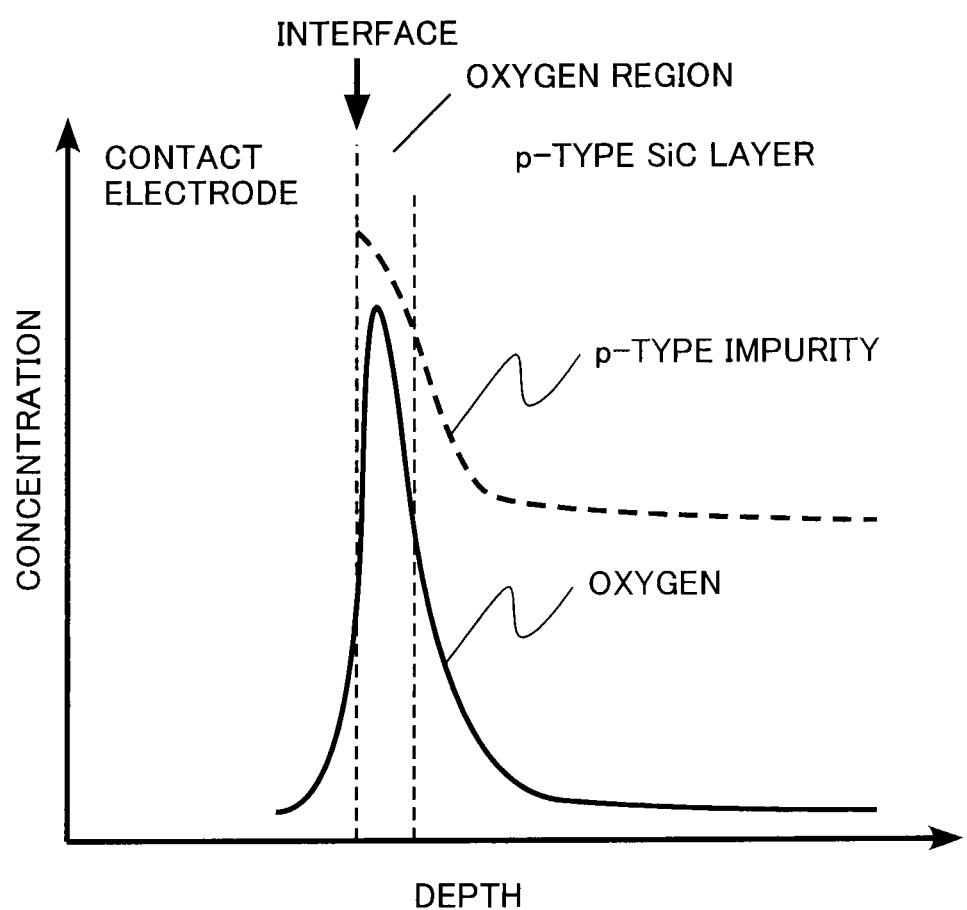
FIG. 10 is a diagram showing the elemental profiles of a semiconductor device according to a second embodiment.

FIG. 10 is a diagram showing the elemental profiles of the semiconductor device according to this embodiment. This diagram shows the concentration profiles of oxygen and the p-type impurity in a cross-section including the p-type anode layer (p-type SiC layer) 12 and the anode electrode (contact electrode) 14.

As shown in FIG. 10, the peak of the oxygen concentration exists on the anode layer side of the interface between the anode layer 12 and the anode electrode 14. The region including this peak is the oxygen region 16. The p-type impurity is segregated in the interface between the anode layer 12 and the anode electrode 14.

Figure 11:
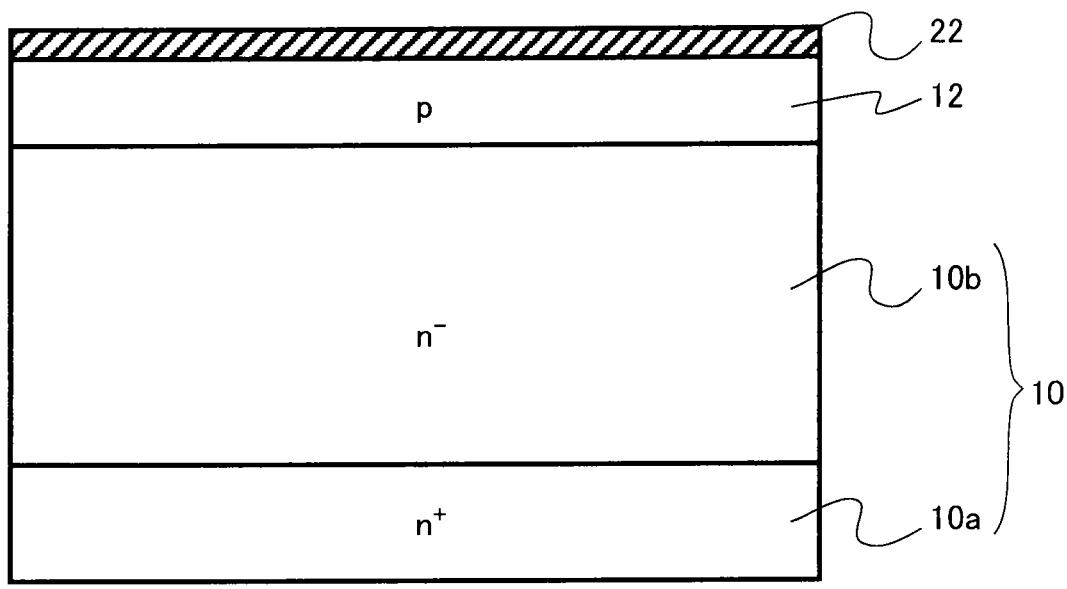
FIG. 11 is a schematic cross-sectional view of the semiconductor device being manufactured by a semiconductor device manufacturing method according to the second embodiment.
Figure 12:
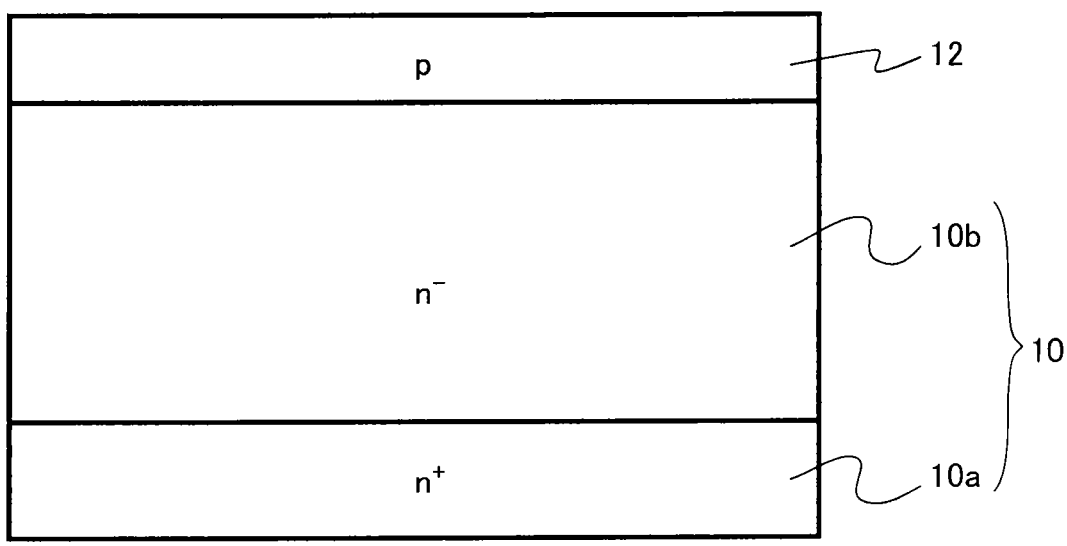
FIG. 12 is a schematic cross-sectional view of the semiconductor device being manufactured by the semiconductor device manufacturing method according to the second embodiment.
Figure 13:
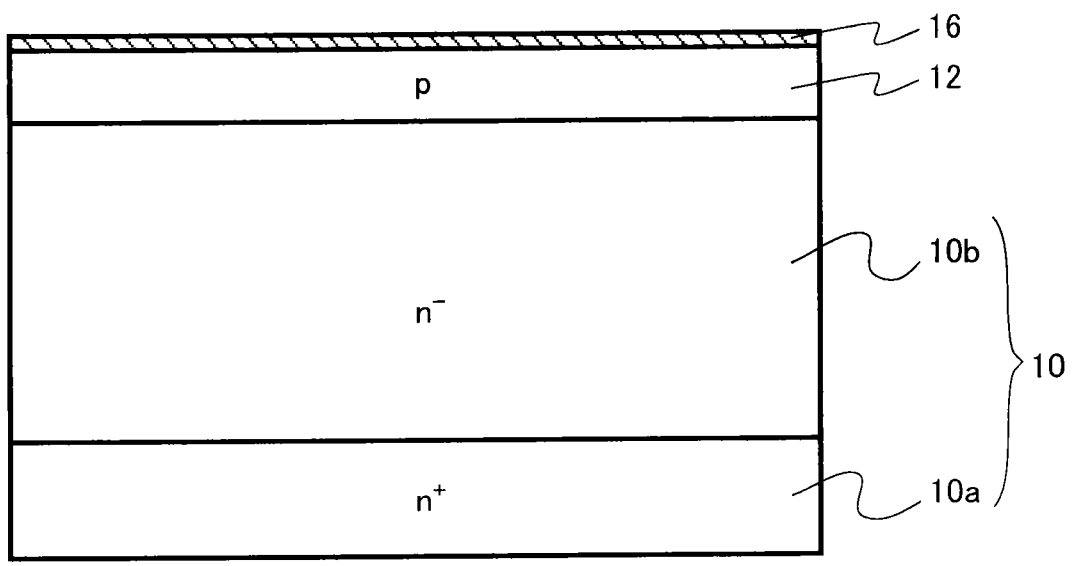
FIG. 13 is a schematic cross-sectional view of the semiconductor device being manufactured by the semiconductor device manufacturing method according to the second embodiment.

Next, the semiconductor device manufacturing method according to this embodiment is described. FIGS. 11 through 13 are schematic cross-sectional views of the semiconductor device being manufactured by the semiconductor device manufacturing method according to this embodiment.

In this embodiment, the p-type anode layer 12 is formed through p-type impurity ion implantation and activation annealing.

A thermally-oxidized film (a second thermally-oxidized film) 22 is then formed on the SiC substrate 10 through thermal oxidation (second thermal oxidation) (FIG. 11). The thermal oxidation is conducted in an oxidizing atmosphere at a temperature not lower than 1200° C. and not higher than 1500° C., for example. A higher temperature is preferable in terms of interstitial carbon diffusion, and a lower temperature is preferable so as to restrain carbon deficiency. The temperature is preferably not lower than 1300° C. and not higher than 1400° C., and is 1300° C., for example.

When the thermally-oxidized film 22 is formed, the p-type impurity of the anode layer 12 is segregated in the interface between the anode layer 12 and the thermally-oxidized film 22. The p-type impurity is preferably at least one element selected from the group consisting of Al (aluminum), B (boron), and Ga (gallium). Segregation of these elements in the interface between a SiC layer and a thermally-oxidized film during thermal oxidation is confirmed by the first-principle calculation.

When the thermally-oxidized film 22 is formed, interstitial carbon diffuses into the SiC substrate 10, and enters carbon vacancies in the SiC substrate 10. As a result, the carbon vacancy concentration in the SiC substrate 10 becomes lower. Particularly, the number of carbon vacancies newly formed at the time of p-type impurity ion implantation decreases.

The thermally-oxidized film 22 is then removed (FIG. 12). For example, the thermally-oxidized film 22 is removed by hydrofluoric-acid wet etching.

In an oxygen-containing atmosphere, a heat treatment is performed under a condition that the amount of oxidized SiC becomes smaller than 1 nm, and the oxygen region 16 is formed on the anode layer 12 (FIG. 13). Thereafter, the PIN diode is manufactured in the same manner as in the first embodiment.

According to this embodiment, the p-type impurity is segregated in the interface between the anode layer 12 and the anode electrode 14. Accordingly, the contact resistance becomes even lower than that in the first embodiment. Also, the number of carbon vacancies formed in the anode layer 12 and the SiC substrate 10 at the time of p-type impurity ion implantation can be reduced through the second thermal oxidation. Accordingly, the lifetime of holes becomes even longer than that in the first embodiment. Thus, a PIN diode with a larger forward current than that in the first embodiment is realized in this embodiment.

According to this embodiment, it is possible to control the carbon vacancy density in the anode layer 12 and the SiC substrate 10 by adjusting conditions such as the temperature and the time of the second thermal oxidation. Accordingly, the lifetime of holes can be adjusted to an optimum value, in view of the characteristics of the PIN diode.

So as to restrain excessive formation of carbon vacancies in the vicinity of the interface between the anode layer 12 and the anode electrode 14, a second heat treatment is preferably performed under a condition that the thickness of the second thermally-oxidized film becomes smaller than the thickness of the first thermally-oxidized film.

Although silicon carbide crystalline structures are 4H—SiC in the above described embodiments, the embodiments can also be applied to silicon carbides having other crystalline structures such as 6H—SiC and 3C—SiC. Also, the contact electrode is formed on the Si face in each of the above embodiments. However, those embodiments can also be applied in cases where the contact electrode is formed on the C face, the A face, the M face, or an intermediate face of those faces.

In each of the above described embodiments, a PIN diode is formed as an example of a semiconductor device. However, the embodiments can also be applied to the p-type SiC layers and the metallic contact electrodes in MISFETs (Metal Insulator Semiconductor Field Effect Transistors) and IGBTs (Insulated Gate Bipolar Transistors).

Also, in each of the above described embodiments, the p-type SiC layer is formed through ion implantation. However, the p-type SiC layer can be formed through epitaxial growth.

In one of the above described embodiments, the first thermal oxidation is conducted before the p-type SiC layer is formed through ion implantation. However, the first thermal oxidation may be skipped.

While certain embodiments have been described, these embodiments have been presented by way of example only, and are not intended to limit the scope of the inventions. Indeed, the semiconductor device and the method of manufacturing the same described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising a diode:
the diode comprising:
a p-type SiC layer;
an n-type SiC layer;
a first electrode electrically connected to the p-type SiC layer, the first electrode including metal;
a second electrode electrically connected to the n-type SiC layer, the p-type SiC layer and the n-type SiC layer being interposed between the first electrode and the second electrode, the n-type SiC layer being interposed between the p-type SiC layer and the second electrode: and
a region provided in the p-type SiC layer, the region being in contact with the first electrode, the region being SiC including oxygen, the region having an oxygen concentration not lower than $1 \times 10^{16}$ cm$^{-3}$ and not higher than $1 \times 10^{21}$ cm$^{-3}$.

2. The device according to claim 1, wherein the oxygen concentration in the region is not lower than $1 \times 10^{17}$ cm$^{-3}$ and not higher than $1 \times 10^{20}$ cm$^{-3}$.

3. The device according to claim 1, wherein a distance between a position of a peak of the oxygen concentration in the region and an interface between the p-type SiC layer and the first electrode is 10 nm or shorter.

4. The device according to claim 1, wherein a full width at half maximum of a peak of the oxygen concentration in the region is 10 nm or smaller.

5. The device according to claim 1, wherein a Si—O—Si bond exists in the region.

6. The device according to claim 1, wherein oxygen substitutes carbon position of a SiC lattice in the region.

7. The device according to claim 1, wherein the metal is Ni (nickel).

8. The device according to claim 1, wherein a p-type impurity is segregated in an interface between the p-type SiC layer and the contact electrode.

9. The device according to claim 8, wherein the p-type impurity is at least one element selected from the group consisting of Al (aluminum), B (boron), and Ga (gallium).

10. The device according to claim 1, wherein the diode is configured such that upon application of a forward bias between the first electrode and the second electrode, a forward electric current flows between the first electrode and the second electrode.

11. The device according to claim 1, wherein the diode is configured such that upon application of a forward bias between the first electrode and the second electrode, a forward electric current flows in the region.

12. The device according to claim 1, wherein the diode is configured such that upon application of a forward bias between the first electrode and the second electrode, a large forward electric current flows in the region.

* * * * *